US012802737B2

(12) United States Patent
Spica

(10) Patent No.: US 12,802,737 B2
(45) Date of Patent: Nov. 17, 2026

(54) PEAK POWER DEMAND BALANCING IN MEMORY DEVICES

(71) Applicant: Micron Technology, Inc., Boise, ID (US)

(72) Inventor: Michael R. Spica, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 109 days.

(21) Appl. No.: 19/021,921

(22) Filed: Jan. 15, 2025

(65) Prior Publication Data

US 2025/0266077 A1 Aug. 21, 2025

Related U.S. Application Data

(60) Provisional application No. 63/554,683, filed on Feb. 16, 2024.

(51) Int. Cl.
*G11C 11/4072* (2006.01)
*G06F 12/10* (2016.01)
*H10B 12/00* (2023.01)

(52) U.S. Cl.
CPC .......... *G11C 11/4072* (2013.01); *G06F 12/10* (2013.01); *H10B 12/00* (2023.02)

(58) Field of Classification Search
CPC ................................................ G11C 11/4072
USPC ........................................................ 365/226
See application file for complete search history.

(56) References Cited

U.S. PATENT DOCUMENTS

| | | | | |
|---|---|---|---|---|
| 10,839,866 | B1 * | 11/2020 | Mohanty | G11C 5/14 |
| 2005/0259493 | A1 * | 11/2005 | Walker | G11C 11/406 365/222 |
| 2017/0003981 | A1 * | 1/2017 | Erez | G06F 3/0685 |
| 2018/0253129 | A1 * | 9/2018 | Singh | G11C 16/20 |
| 2021/0141944 | A1 * | 5/2021 | Meier | G06F 21/79 |
| 2023/0393760 | A1 * | 12/2023 | Vlasov | G06F 3/0619 |
| 2023/0418487 | A1 * | 12/2023 | Kim | G06F 3/0604 |
| 2024/0214069 | A1 * | 6/2024 | Qin | H04B 10/07955 |

* cited by examiner

*Primary Examiner* — Muna A Techane
(74) *Attorney, Agent, or Firm* — Harrity & Harrity, LLP

(57) ABSTRACT

In some implementations, a memory device may determine that a power-up event for multiple banks of memory components is to be performed. The memory device may determine a power-up sequence for the multiple banks of memory components based on determining that the power-up event is to be performed, wherein the power-up sequence includes a sequential order in which to power up the multiple banks of memory components. The memory device may perform the power-up event based on the power-up sequence.

20 Claims, 8 Drawing Sheets

PEAK POWER DEMAND BALANCING IN MEMORY DEVICES

CROSS-REFERENCE TO RELATED APPLICATION

This patent application claims priority to U.S. Provisional Patent Application No. 63/554,683, filed on Feb. 16, 2023, entitled "PEAK POWER DEMAND BALANCING IN MEMORY DEVICES," and assigned to the assignee hereof. The disclosure of the prior application is considered part of and is incorporated by reference into this patent application.

TECHNICAL FIELD

The present disclosure generally relates to memory devices, memory device operations, and, for example, to peak power demand balancing in memory devices.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). To store information, an electronic device may write to, or program, a set of memory cells. To access the stored information, the electronic device may read, or sense, the stored state from the set of memory cells.

Various types of memory devices exist, including random access memory (RAM), read only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), holographic RAM (HRAM), flash memory (e.g., NAND memory and NOR memory), and others. A memory device may be volatile or non-volatile. Non-volatile memory (e.g., flash memory) can store data for extended periods of time even in the absence of an external power source. Volatile memory (e.g., DRAM) may lose stored data over time unless the volatile memory is refreshed by a power source. In some examples, a memory device may be associated with a compute express link (CXL). For example, the memory device may be a CXL compliant memory device and/or may include a CXL interface.

DETAILED DESCRIPTION

Figure 1:
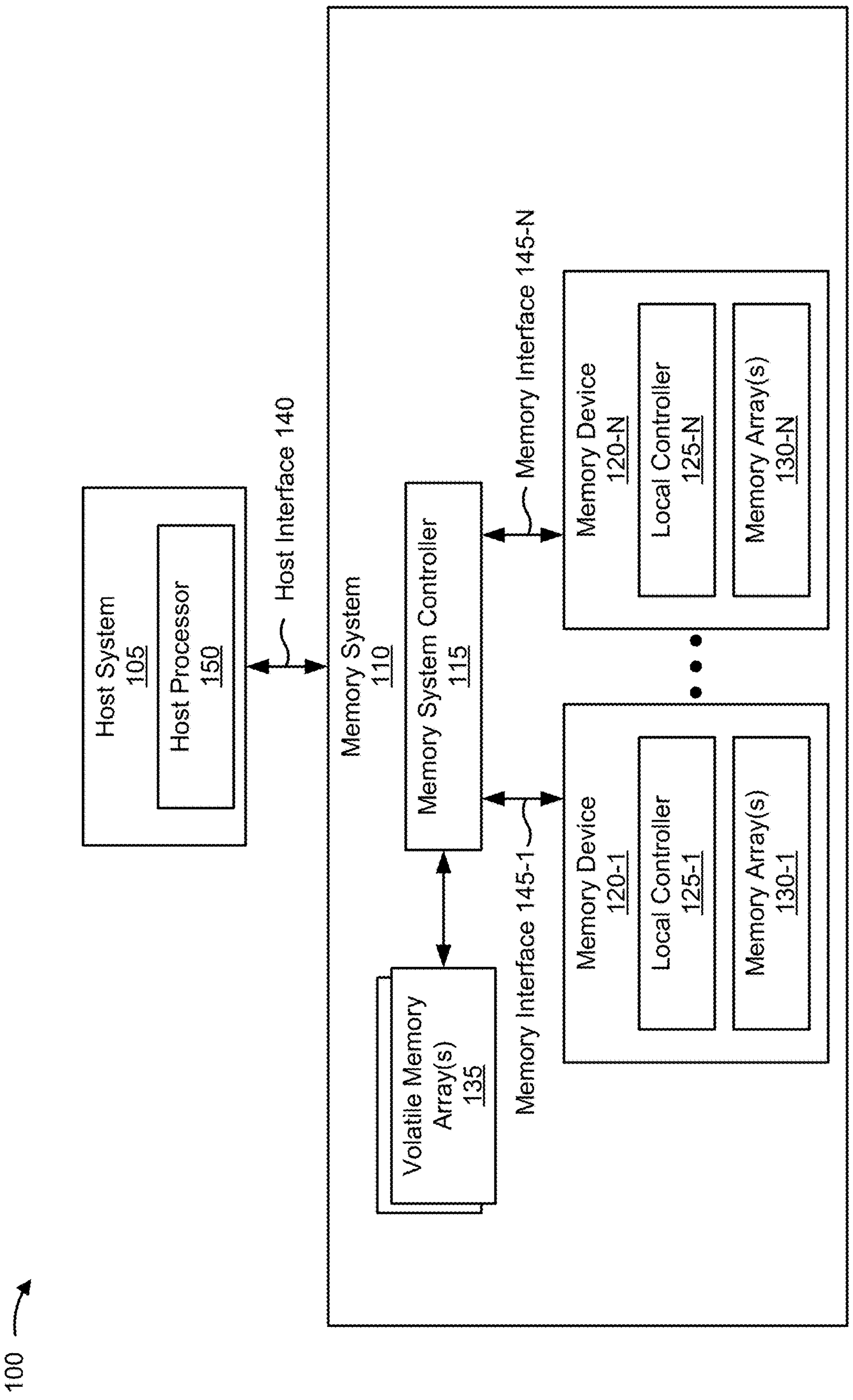
FIG. 1 is a diagram illustrating an example system capable of peak power demand balancing in memory devices.

As memory devices continue to evolve, large quantities of memory components may be included in memory devices, creating a strain on power delivery systems in the memory devices. For example, compute express link (CXL) compliant memory devices (sometimes referred to as CXL memory devices, or simply CXL devices, for ease of description) may include numerous dynamic random access memory (DRAM) dies, each having high power consumption needs. Accordingly, during certain power-up events associated with the DRAM dies, a power demand for the DRAM dies may overrun a power control component of a memory device, causing premature failure of the device, faulty operation of the device, and/or otherwise unreliable memory operations. Moreover, when a power control component is overrun by powering up the multiple DRAM dies or otherwise, certain high-priority DRAM dies may not be powered-on in a timely fashion, leading to poor memory device performance, high memory device errors, and otherwise high power, computing, and storage resource consumption to correct memory device errors.

Some implementations described herein provide peak power demand balancing for a memory device, such as by enabling spreading of power delivery to multiple DRAM dies in a CXL device over time in order to avoid superposition of high power demands at multiple dies at once. In some implementations, a media subsystem of a memory device (e.g., an array of DRAM dies) may be organized into multiple logical banks of memory components. A memory device, and more particularly a controller of a memory device, may determine that a power-up event for the multiple banks of memory components is to be performed, such as an initial power-on operation of the memory device, a refresh operation of the memory device (e.g., an operation associated with refreshing DRAM memory in order to avoid data loss), or a similar power-up event associated with a peak power demand. Moreover, the memory device may determine a power-up sequence for the multiple banks of memory components, which may be a sequential order in which to power up the multiple banks of memory components in order to avoid supplying high power levels to all of the components at once. Accordingly, the memory device may perform the power-up event based on the sequence, such as by sequentially turning on and/or refreshing the banks of memory components according to the power-up sequence. For example, the memory device may power up a first bank of memory components (e.g., DRAM dies) followed by a delay, then may power on a second bank of memory components followed by a delay, and so forth until each bank that is to be powered up according to the power-up event is powered up. In some aspects, the memory device may determine the power-up sequence and/or may power up the banks of memory components in such a way as to prioritize certain high-priority memory components (e.g., by placing banks containing high-priority memory components highest in a priority queue associated with the power-up sequence and/or by powering up high-priority banks prior to powering up low-priority banks). As a result, a power control component of a high-density memory device may effectively balance a power demand over time, thereby avoiding peaks of power demand that may otherwise surpass a power capacity of the memory device, and/or may power up high-priority components in a timely manner. This may result in increased longevity of the memory device, improved memory device performance, reduced memory device errors, and otherwise reduced power, computing, and storage resource consumption that would have otherwise been required to correct memory device errors.

FIG. 1 is a diagram illustrating an example system 100 capable of peak power demand balancing in memory devices. The system 100 may include one or more devices, apparatuses, and/or components for performing operations described herein. For example, the system 100 may include a host system 105 and a memory system 110. The memory system 110 may include a memory system controller 115 and one or more memory devices 120, shown as memory devices 120-1 through 120-N (where N≥1). A memory device may include a local controller 125 and one or more memory arrays 130. The host system 105 may communicate with the memory system 110 (e.g., the memory system controller 115 of the memory system 110) via a host interface 140. The memory system controller 115 and the memory devices 120 may communicate via respective memory interfaces 145, shown as memory interfaces 145-1 through 145-N (where N≥1).

The system 100 may be any electronic device configured to store data in memory. For example, the system 100 may be a computer, a mobile phone, a wired or wireless communication device, a network device, a server, a device in a data center, a device in a cloud computing environment, a vehicle (e.g., an automobile or an airplane), and/or an Internet of Things (IoT) device. The host system 105 may include a host processor 150. The host processor 150 may include one or more processors configured to execute instructions and store data in the memory system 110. For example, the host processor 150 may include a central processing unit (CPU), a graphics processing unit (GPU), a field-programmable gate array (FPGA), an application-specific integrated circuit (ASIC), and/or another type of processing component.

The memory system 110 may be any electronic device or apparatus configured to store data in memory. For example, the memory system 110 may be a hard drive, a solid-state drive (SSD), a flash memory system (e.g., a NAND flash memory system or a NOR flash memory system), a universal serial bus (USB) drive, a memory card (e.g., a secure digital (SD) card), a secondary storage device, a non-volatile memory express (NVMe) device, an embedded multimedia card (eMMC) device, a dual in-line memory module (DIMM), and/or a random-access memory (RAM) device, such as a dynamic RAM (DRAM) device or a static RAM (SRAM) device.

The memory system controller 115 may be any device configured to control operations of the memory system 110 and/or operations of the memory devices 120. For example, the memory system controller 115 may include control logic, a memory controller, a system controller, an ASIC, an FPGA, a processor, a microcontroller, and/or one or more processing components. In some implementations, the memory system controller 115 may communicate with the host system 105 and may instruct one or more memory devices 120 regarding memory operations to be performed by those one or more memory devices 120 based on one or more instructions from the host system 105. For example, the memory system controller 115 may provide instructions to a local controller 125 regarding memory operations to be performed by the local controller 125 in connection with a corresponding memory device 120.

A memory device 120 may include a local controller 125 and one or more memory arrays 130. In some implementations, a memory device 120 includes a single memory array 130. In some implementations, each memory device 120 of the memory system 110 may be implemented in a separate semiconductor package or on a separate die that includes a respective local controller 125 and a respective memory array 130 of that memory device 120. The memory system 110 may include multiple memory devices 120.

A local controller 125 may be any device configured to control memory operations of a memory device 120 within which the local controller 125 is included (e.g., and not to control memory operations of other memory devices 120). For example, the local controller 125 may include control logic, a memory controller, a system controller, an ASIC, an FPGA, a processor, a microcontroller, and/or one or more processing components. In some implementations, the local controller 125 may communicate with the memory system controller 115 and may control operations performed on a memory array 130 coupled with the local controller 125 based on one or more instructions from the memory system controller 115. As an example, the memory system controller 115 may be an SSD controller, and the local controller 125 may be a NAND controller.

A memory array 130 may include an array of memory cells configured to store data. For example, a memory array 130 may include a non-volatile memory array (e.g., a NAND memory array or a NOR memory array) or a volatile memory array (e.g., an SRAM array or a DRAM array). In some implementations, the memory system 110 may include one or more volatile memory arrays 135. A volatile memory array 135 may include an SRAM array and/or a DRAM array, among other examples. The one or more volatile memory arrays 135 may be included in the memory system controller 115, in one or more memory devices 120, and/or in both the memory system controller 115 and one or more memory devices 120. In some implementations, the memory system 110 may include both non-volatile memory capable of maintaining stored data after the memory system 110 is powered off and volatile memory (e.g., a volatile memory array 135) that requires power to maintain stored data and that loses stored data after the memory system 110 is powered off. For example, a volatile memory array 135 may cache data read from or to be written to non-volatile memory, and/or may cache instructions to be executed by a controller of the memory system 110.

The host interface 140 enables communication between the host system 105 (e.g., the host processor 150) and the memory system 110 (e.g., the memory system controller 115). The host interface 140 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a Universal Flash Storage (UFS) interface, an eMMC interface, a double data rate (DDR) interface, and/or a DIMM interface.

The memory interface 145 enables communication between the memory system 110 and the memory device 120. The memory interface 145 may include a non-volatile memory interface (e.g., for communicating with non-volatile memory), such as a NAND interface or a NOR interface. Additionally, or alternatively, the memory interface 145 may include a volatile memory interface (e.g., for communicating with volatile memory), such as a DDR interface.

In some examples, the memory system 110 may be a CXL compliant memory system (sometimes referred to herein simply as a CXL memory system) and/or one or more of the memory devices 120 may be CXL compliant memory devices (sometimes referred to herein simply as CXL memory devices or CXL devices). CXL is a high-speed CPU-to-device and CPU-to-memory interconnect designed to accelerate next-generation performance. CXL technology maintains memory coherency between the CPU memory space and memory on attached devices, which allows resource sharing for higher performance, reduced software stack complexity, and lower overall system cost. CXL is designed to be an industry open standard interface for high-speed communications. CXL technology is built on the PCIe infrastructure, leveraging PCIe physical and electrical interfaces to provide an advanced protocol in areas such as input/output (I/O) protocol, memory protocol, and coherency interface.

In some examples, the memory system 110 may include a PCIe/CXL interface (e.g., the host interface 140 may be associated with a PCIe/CXL interface), which may be a physical interface configured to connect the CXL memory system and/or the CXL memory device to CXL compliant host devices. In such examples, the PCIe/CXL interface may comply with CXL standard specifications for physical connectivity, ensuring broad compatibility and case of integration into existing systems using the CXL protocol. Additionally, or alternatively, a CXL memory system and/or a CXL memory device may be designed to efficiently interface with computing systems (e.g., the host system 105) by leveraging the CXL protocol. For example, a CXL memory system and/or a CXL memory device may be configured to utilize high-speed, low-latency interconnect capabilities of CXL, such as for a purpose of making the CXL memory system and/or the CXL memory device suitable for high-performance computing, data center applications, artificial intelligence (AI) applications, and/or similar applications.

A CXL memory system and/or a CXL memory device may include a CXL memory controller (e.g., memory system controller 115 and/or local controller 125), which may be configured to manage data flow between memory arrays (e.g., volatile memory arrays 135 and/or memory arrays 130) and a CXL interface (e.g., a PCIe/CXL interface, such as host interface 140). In some examples, the CXL memory controller may be configured to handle one or more CXL protocol layers, such as an I/O layer (e.g., a layer associated with a CXL.io protocol, which may be used for purposes such as device discovery, configuration, initialization, I/O virtualization, direct memory access (DMA) using non-coherent load-store semantics, and/or similar purposes); a cache coherency layer (e.g., a layer associated with a CXL-.cache protocol, which may be used for purposes such as caching host memory using a modified, exclusive, shared, invalid (MESI) coherence protocol, or similar purposes); or a memory protocol layer (e.g., a layer associated with a CXL.memory (sometimes referred to as CXL.mem) protocol, which may enable a CXL memory device to expose host-managed device memory (HDM) to permit a host device to manage and access memory similar to a native DDR connected to the host); among other examples.

A CXL memory system and/or a CXL memory device may further include and/or be associated with one or more high-bandwidth memory modules (HBMMs) or similar memory arrays (e.g., volatile memory arrays 135 and/or memory arrays 130). For example, a CXL memory system and/or a CXL memory device may include multiple layers of DRAM (e.g., stacked and/or interconnected through advanced through-silicon via (TSV) technology) in order to maximize storage density and/or enhance data transfer speeds between memory layers. Additionally, or alternatively, a CXL memory system and/or a CXL memory device may include a power management unit, which may be configured to regulate power consumption associated with the CXL memory system and/or the CXL memory device and/or which may be configured to improve energy efficiency for the CXL memory system and/or the CXL memory device. Additionally, or alternatively, a CXL memory system and/or a CXL memory device may include additional components, such as one or more error correction code (ECC) engines, such as for a purpose of detecting and/or correcting data errors to ensure data integrity and/or improve the overall reliability of the CXL memory system and/or the CXL memory device.

Although the example memory system 110 described above includes a memory system controller 115, in some implementations, the memory system 110 does not include a memory system controller 115. For example, an external controller (e.g., included in the host system 105) and/or one or more local controllers 125 included in one or more corresponding memory devices 120 may perform the operations described herein as being performed by the memory system controller 115. Furthermore, as used herein, a "controller" may refer to the memory system controller 115, a local controller 125, or an external controller. In some implementations, a set of operations described herein as being performed by a controller may be performed by a single controller. For example, the entire set of operations may be performed by a single memory system controller 115, a single local controller 125, or a single external controller. Alternatively, a set of operations described herein as being performed by a controller may be performed by more than one controller. For example, a first subset of the operations may be performed by the memory system controller 115 and a second subset of the operations may be performed by a local controller 125. Furthermore, the term "memory apparatus" may refer to the memory system 110 or a memory device 120, depending on the context.

A controller (e.g., the memory system controller 115, a local controller 125, or an external controller) may control operations performed on memory (e.g., a memory array 130), such as by executing one or more instructions. For example, the memory system 110 and/or a memory device 120 may store one or more instructions in memory as firmware, and the controller may execute those one or more instructions. Additionally, or alternatively, the controller may receive one or more instructions from the host system 105 and/or from the memory system controller 115, and may execute those one or more instructions. In some implementations, a non-transitory computer-readable medium (e.g., volatile memory and/or non-volatile memory) may store a set of instructions (e.g., one or more instructions or code) for execution by the controller. The controller may execute the set of instructions to perform one or more operations or methods described herein. In some implementations, execution of the set of instructions, by the controller, causes the controller, the memory system 110, and/or a memory device 120 to perform one or more operations or methods described herein. In some implementations, hardwired circuitry is used instead of or in combination with the one or more instructions to perform one or more operations or methods described herein. Additionally, or alternatively, the controller may be configured to perform one or more operations or methods described herein. An instruction is sometimes called a "command."

For example, the controller (e.g., the memory system controller 115, a local controller 125, or an external controller) may transmit signals to and/or receive signals from memory (e.g., one or more memory arrays 130) based on the one or more instructions, such as to transfer data to (e.g., write or program), to transfer data from (e.g., read), to erase, and/or to refresh all or a portion of the memory (e.g., one or more memory cells, pages, sub-blocks, blocks, or planes of the memory). Additionally, or alternatively, the controller may be configured to control access to the memory and/or to provide a translation layer between the host system 105 and the memory (e.g., for mapping logical addresses to physical addresses of a memory array 130). In some implementations, the controller may translate a host interface command (e.g., a command received from the host system 105) into a memory interface command (e.g., a command for performing an operation on a memory array 130).

In some implementations, one or more systems, devices, apparatuses, components, and/or controllers of FIG. 1 may be configured to determine that a power-up event for multiple banks of memory components is to be performed; determine a power-up sequence for the multiple banks of memory components based on determining that the power-up event is to be performed, wherein the power-up sequence includes a sequential order in which to power up the multiple banks of memory components; and perform the power-up event based on the power-up sequence.

In some implementations, one or more systems, devices, apparatuses, components, and/or controllers of FIG. 1 may be configured to determine that a power-up event for multiple banks of DRAM components is to be performed; determine a power-up sequence for the multiple banks of DRAM components based on determining that the power-up event is to be performed, wherein the power-up sequence includes a sequential order in which to power up the multiple banks of DRAM components; and cause a power regulation component to perform the power-up event based on the power-up sequence.

The number and arrangement of components shown in FIG. 1 are provided as an example. In practice, there may be additional components, fewer components, different components, or differently arranged components than those shown in FIG. 1. Furthermore, two or more components shown in FIG. 1 may be implemented within a single component, or a single component shown in FIG. 1 may be implemented as multiple, distributed components. Additionally, or alternatively, a set of components (e.g., one or more components) shown in FIG. 1 may perform one or more operations described as being performed by another set of components shown in FIG. 1.

FIGS. 2A-2F are diagrams of an example 200 of peak power demand balancing in memory devices. The operations described in connection with FIGS. 2A-2F may be performed by the memory system 110 and/or one or more components of the memory system 110, such as the memory system controller 115, one or more memory devices 120, and/or one or more local controllers 125.

Figure 2A:
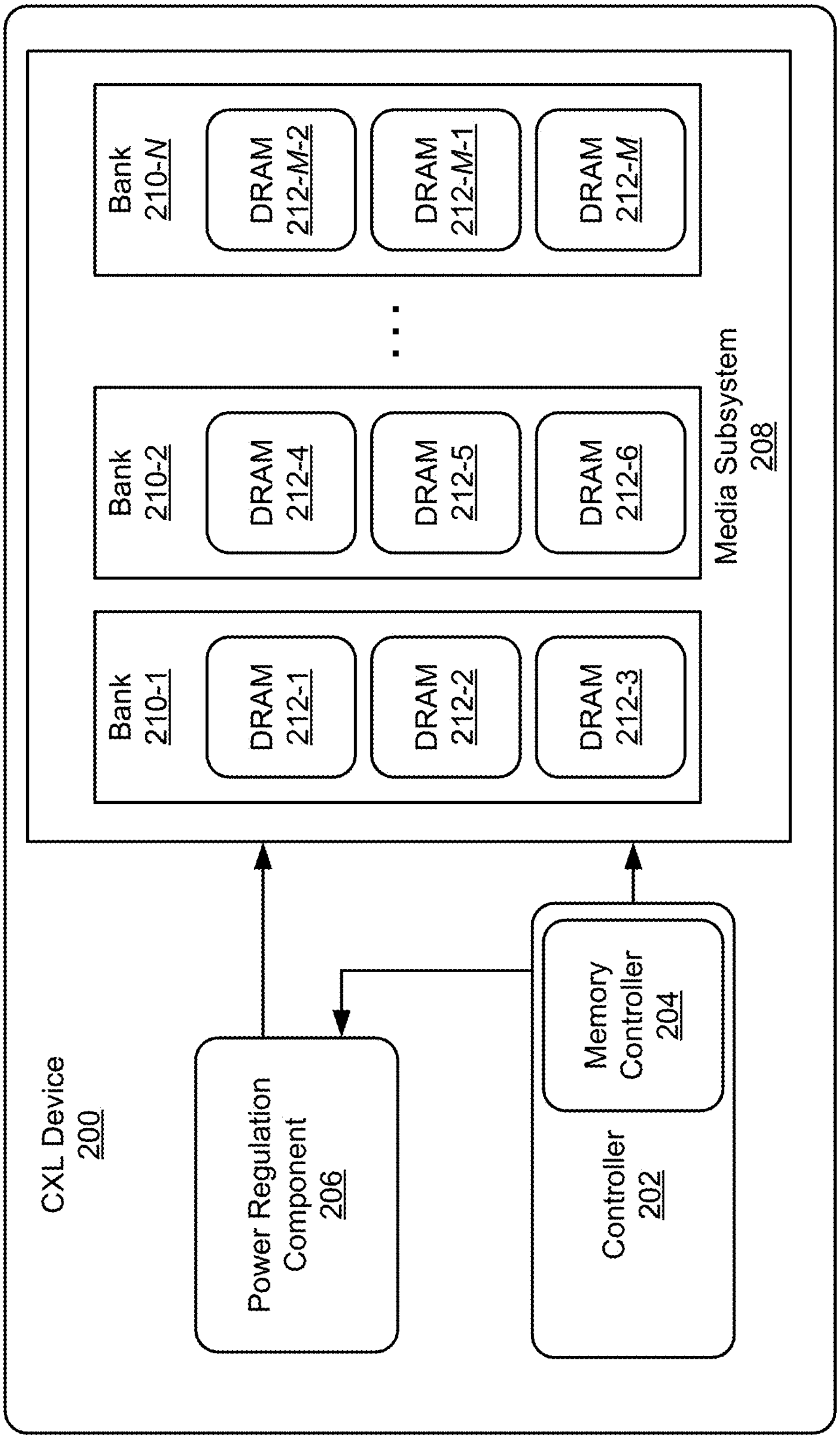
FIGS. 2A-2F are diagrams of an example of peak power demand balancing in memory devices.

As shown in FIG. 2A, certain operations described herein may be performed by a memory device, such as a CXL device 200 or a similar memory device. Although for case of description the operations described herein are described in connection with the CXL device 200, in some other implementations the operations described herein may be performed by another type of memory device (e.g., a type of memory device other than a CXL compliant memory device) without departing from the scope of the disclosure. The CXL device 200 may include a central controller 202 (which may correspond to the memory system controller 115), and/or a memory controller 204 (which may correspond to the local controller 125). In some implementations, the memory controller 204 may be part of the central controller 202, such as within an ASIC collectively forming the central controller 202, the memory controller 204, and/or other components of the CXL device 200. Put another way, in some implementations, the memory controller 204 may be embedded within the central controller 202, as depicted in FIG. 2A. However, in some other implementations, the memory controller 204 may not be embedded within the central controller 202, and/or the memory controller 204 may be a separate and distinct component from the central controller 202.

In some implementations, the CXL device 200 may include a power regulation component 206. The power regulation component 206 may be in communication with the central controller 202 and/or a media subsystem 208 of the CXL device 200, among other components. In some implementations, the power regulation component 206 may be configured to receive power control commands from the central controller 202 and/or may be configured to control a power supply to the media subsystem 208 (e.g., based on receiving one or more power control commands from the central controller 202). In some implementations, the power regulation component 206 may perform voltage regulation functions, such as by converting power supplied from a power source (not shown) to voltages required by the media subsystem 208 and/or other components of the CXL device 200. For example, the power regulation component 206 may be capable of stepping down voltages to a level needed for digital circuits, among other operations. Additionally, or alternatively, the power regulation component 206 may perform power distribution functions, such as by ensuring that power is evenly and efficiently distributed across components of the CXL device 200. Additionally, or alternatively, the power regulation component 206 may perform thermal management functions, such as by working in conjunction with one or more thermal management components (not shown) to monitor and/or control a temperature of the CXL device 200. For example, by adjusting power usage, the power regulation component 206 may have a capability of reducing heat output, thereby preventing overheating and/or potential thermal throttling of the CXL device 200. Additionally, or alternatively, the power regulation component 206 may perform energy efficiency functions, such as by optimizing energy use, reducing power consumption during idle periods, dynamically adjusting power distribution based on workload demands, or the like. Additionally, or alternatively, the power regulation component 206 may have a capability of handling high-speed data transfer and multi-device interoperability, such as by managing power distribution in a way that is transparent and/or coherent across devices connected via a CXL fabric.

In some implementations, the media subsystem 208 may include multiple memory components (e.g., an array of memory dies, such as the memory arrays 130) logically arranged into multiple banks 210 (shown in FIG. 2A as a first bank 210-1 through an N-th bank 210-N). More particularly, the CXL device 200 may include M DRAM components 212 (shown in FIG. 2A as a first DRAM component 212-1 through an M-th DRAM component 212-M) logically organized into the N banks 210. In the example shown in FIG. 2A, each bank 210 is shown as containing three DRAM components 212, for case of description, but in some other implementations, a bank 210 may include more or fewer components and/or different types of memory components, without departing from the scope of the disclosure.

In some implementations, a power-up event may need to be performed for the memory subsystem 208, in which most or all of the memory components (e.g., the DRAM components 212) are required to be powered up (sometimes referred to herein as being powered on) and/or in which most or all of the memory components are associated with a high power demand. As used herein, "powering up" or "powering on" a memory component means that electrical power is provided to the component, such as for a purpose of initiating an operation on the component. When powering up a DRAM component 212 of the media subsystem 208, the power regulation component 206 may apply a specific voltage to the DRAM component 212 (e.g., a voltage detailed in a specification of the CXL device 200, or the like). For example, during powering up of a DRAM component 212, the power regulation component 206 may ensure that supply voltages (e.g., a positive side voltage associated with a memory array ($V_{DD}$), or a positive side voltage associated with an I/O interface ($V_{DDQ}$), among other examples) reach stable voltage levels within specified tolerances.

In some implementations, "power-up event" may refer to an initial power-on operation associated with the CXL device 200. For example, an initial power-on operation may include applying a correct supply power to the DRAM components 212 (e.g., according to device specifications and/or the like), performing a self-test and/or calibration associated with the DRAM components 212 (e.g., checking for basic functionality, adjusting optimal operating parameters, calibrating interfaces for timing and/or signal integrity, among other operations), and/or performing a memory training process (e.g., a process in which the memory controller 204 tests various timing, voltage, and/or operational parameters, such as for a purpose of identifying optimal settings for communication with the DRAM components 212), among other operations. According, in cases in which every DRAM component 212 is powered on at a same time, an initial power-on operation may be associated with a spike in power demand by the CXL device 200.

In some other implementations, "power-up event" may refer to a refresh operation associated with the CXL device 200. For example, a refresh operation may be associated with periodically (e.g., according to a refresh rate, which may be 32 milliseconds or a similar time period) refreshing host data stored at the DRAM components 212. Refreshing host data may include, on a row-by-row basis, activating a row in a DRAM component 212 to cause charge stored in the capacitors of the corresponding row to be transferred to a row buffer, restoring (e.g., writing back) the charges to the capacitors in the row to ensure that each capacitor is recharged to a proper level, and closing the row (sometimes referred to as row precharge) such that the row buffer may be prepared to access a subsequent row. According, in cases in which refresh operations for DRAM components 212 overlap, a refresh operation may be associated with a spike in power demand by the CXL device 200.

In some implementations, in order to reduce a spike in power demand caused by a power-up event (e.g., an initial power-on operation, a refresh operation, and/or a similar power-up event), the CXL device 200 may be capable of balancing power demand over time, such as by sequentially powering up the banks 210 of DRAM components 212 such that a peak power demand with each bank 210 does not completely overlap. For example, in cases in which a power-up event is associated with an initial power-on operation, the CXL device 200 may use a staggered power-up routine to power up the banks 210, such as by powering on the banks 210 according to a priority queue or the like (e.g., powering on the banks 210 in order of importance). In such implementations, the memory controller 204 and/or a similar component of the CXL device 200 may initiate training, startup sequences, or the like to a selected bank 210 of DRAM components 212 while refraining from initiating similar processes on other banks 210. Then, after some delay (e.g., after a training, startup sequence, or the like has been completed), the memory controller 204 and/or a similar component of the CXL device 200 may move on to another bank 210 of DRAM components 212 and initiate training, startup sequences, or the like. In cases in which a power-up event is associated with a refresh operation, the memory controller 204 and/or other components of the CXL device 200 may monitor and/or distribute refresh sequences to the banks 210 of DRAM components 212 to avoid a complete superposition of the refresh operations. In this regard, the refresh operations at the media subsystem 208 may be balanced in such a way as to avoid an in-rush of power demand at the power regulation component 206.

Figure 2B:
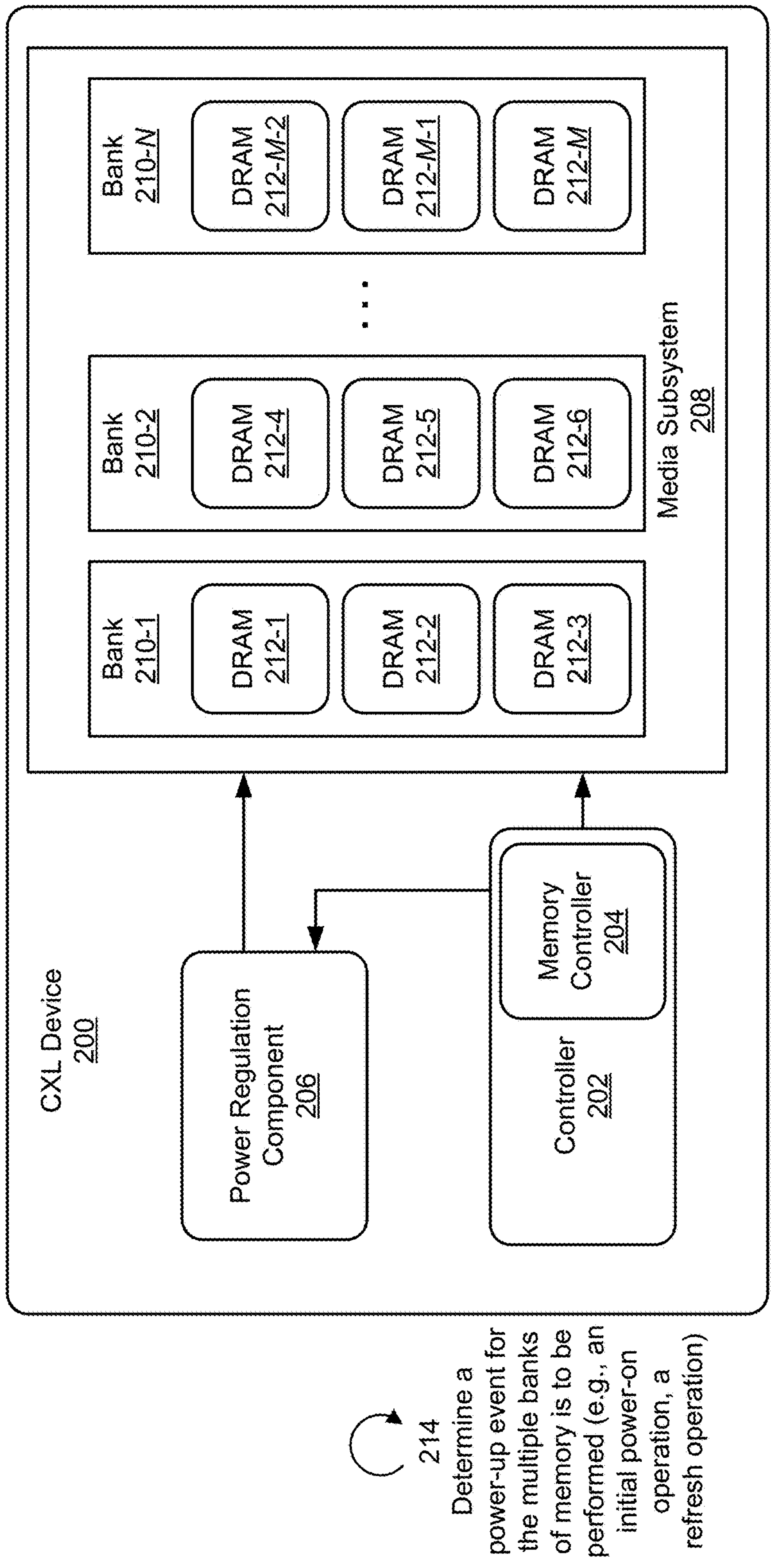

More particularly, as shown in FIG. 2B, and as indicated by reference number 214, in some implementations the CXL device 200 (e.g., the central controller 202 and/or the memory controller 204 of the CXL device 200) may determine that a power-up event for the multiple banks 210 of DRAM components 212 is to be performed. For example, the CXL device 200 may determine that an initial power-on operation is to be performed (e.g., an operation in which a correct supply power is to be supplied to the DRAM components 212, a self-test and/or calibration associated with the DRAM components 212 is to be performed, and/or a memory training process associated with the DRAM components 212 is to be performed, among other processes), as described above. Additionally, or alternatively, the CXL device 200 may determine that a refresh operation is to be performed (e.g., multiple row activation processes are to be performed, multiple charge restoration processes are to be performed, and/or multiple row precharge operations are to be performed, among other processes), as described above.

Figure 2C:
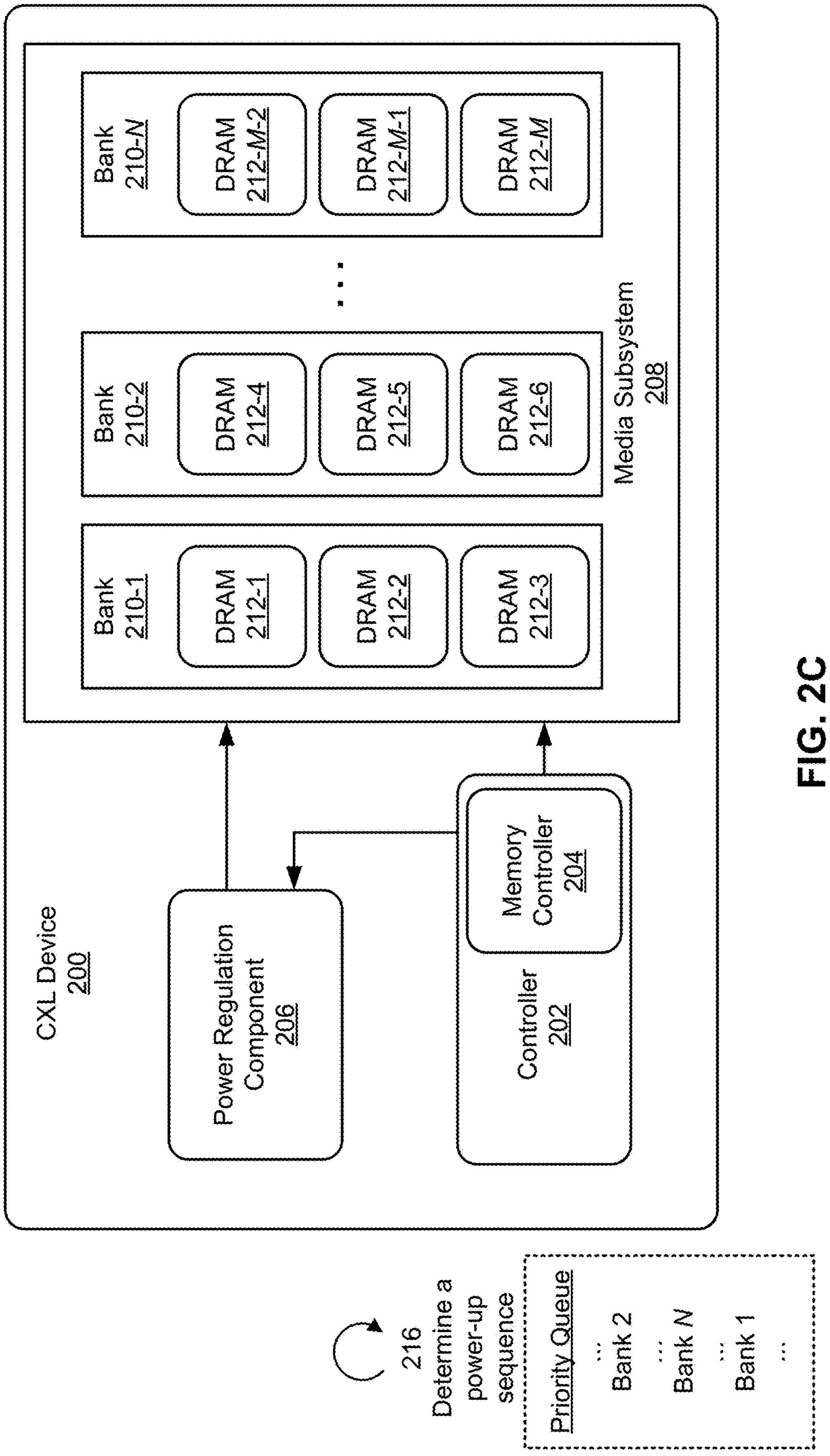

Accordingly, as shown in FIG. 2C, and as indicated by reference number 216, the CXL device 200 may determine a power-up sequence to be used for the power-up event. As described above, the power-up sequence may be associated with a sequential order in which to power up the multiple banks 210 of DRAM components 212 during the power-up event, such as for a purpose of balancing a peak power demand of the DRAM components 212 over time and/or avoiding an in-rush of power demand at the power regulation component 206. In some implementations, determining the power-up sequence may include mapping logical addresses of the multiple DRAM components 212 to respective physical locations of the multiple DRAM components 212 (e.g., mapping logical addresses of each DRAM component 212 to a physical identifier associated with a corresponding bank 210 for the DRAM components 212, or the like). For example, when the power-up event is associated with a refresh operation, the memory controller 204 may be configured to manage the refresh operation based on a logical to physical mapping of the DRAM components 212 such that a staggered refresh may be performed to avoid a superposition of the peak power demands of the DRAM components and/or to smooth a current profile associated with the power regulation component 206.

Additionally, or alternatively, to determine the power-up sequence, the CXL device 200 may be configured to determine the power-up sequence based on respective power-up priority levels associated with the multiple banks 210 of DRAM components 212. For example, the CXL device 200 may identify a priority queue associated with the banks 210 of DRAM components 212 such that high priority banks 210 (e.g., banks 210 for which the CXL device 200 and/or a host system (e.g., host system 105) require access relatively quickly) are powered-on and/or refreshed early in the sequence, and/or such that low priority banks 210 (e.g., banks 210 for which the CXL device 200 and/or a host system does not require access relatively quickly and/or that are rarely accessed) are powered-on and/or refreshed later in the sequence. Put another way, in determining the power-up sequence, the CXL device 200 may identify that a certain bank 210 (e.g., the second bank 210-2 in the example shown in FIG. 2C) is associated with a higher power-up priority level than a power-up priority level of another bank 210 (e.g., the first bank 210-1 in the example shown in FIG. 2C), and thus the CXL device 200 may determine that the certain bank 210 is to be powered up earlier in the power-up sequence than the other bank 210. For example, as shown in FIG. 2C, in this implementation the CXL device 200 may determine that, of the three depicted banks 210, the second bank 210-2 has a highest priority, the N-th bank 210-N has a next highest priority, and the first bank 210-1 has a lowest priority. Accordingly, in determining the power-up sequence, the CXL device 200 may identify a priority queue that places the second bank 210-2 higher (and thus earlier in the power-up sequence) than the N-th bank 210-N and the first bank 210-1, and/or that places the N-th bank 210-N higher (and thus carlier in the power-up sequence) than the first bank 210-1.

Figure 2D:
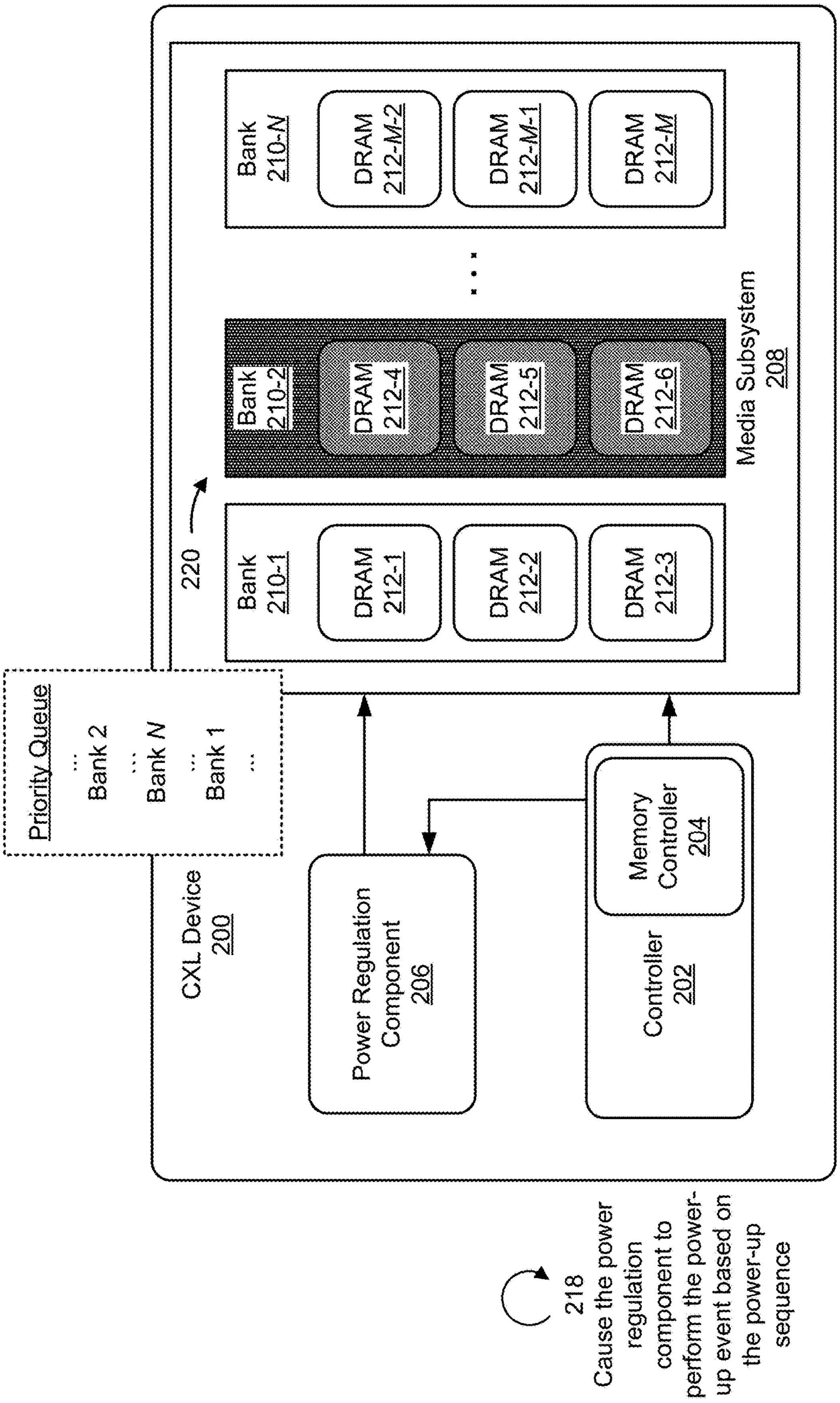

As shown in FIG. 2D, and as indicated by reference number 218, the CXL device 200 (e.g., the central controller 202 and/or the memory controller 204 of the CXL device 200), may cause the power regulation component 206 to perform the power-up event based on the power-up sequence, such as by sequentially powering up the banks 210 of DRAM components 212 (e.g., supplying power as part of an initial power-on operation, supplying power as part of a refresh operation, and/or the like) according to the priority queue or a similar sequential queue. For example, as described above, the determined power-up sequence may include powering up the second bank 210-2 prior to powering up the first bank 210-1 and the N-th bank 210-N. Accordingly, as indicated by reference number 220, of the three banks shown in FIG. 2D, the power regulator component 206 may first supply power associated with the power-up event to the second bank 210-2 (depicted using dark stippling).

Figure 2E:
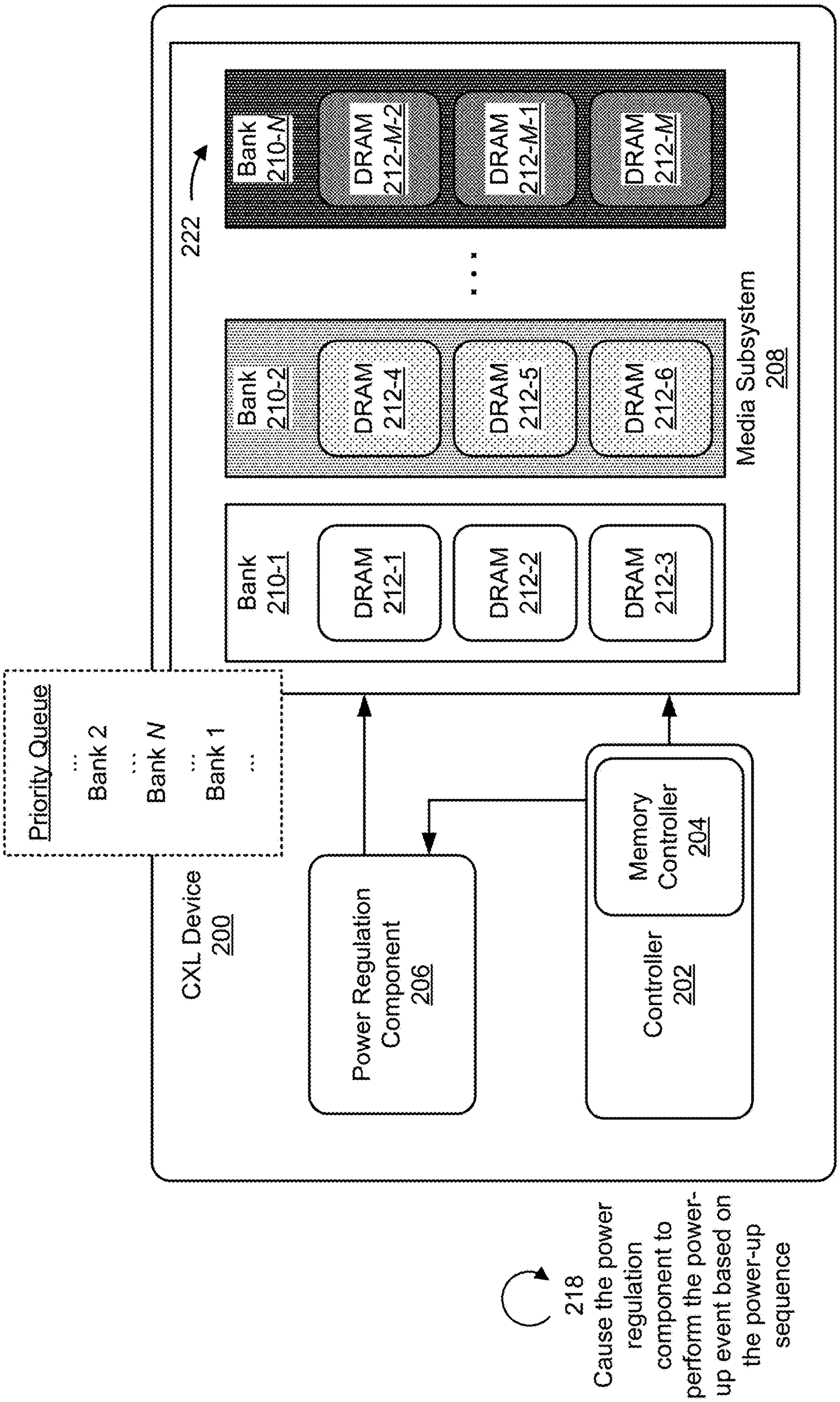

After some configured delay, the power regulation component 206 may continue with supplying power to other banks 210, such as in an order indicated by the priority queue, among other examples. For example, as shown in FIG. 2E, and as indicated by reference number 222, the power regulation component 206 may next supply power to the N-th bank 210-N (again depicted using dark stippling). In some implementations, some other banks 210 that earlier received power as part of the power-on sequence may still have high power needs at the time at which power associated with the power-up sequence is initially supplied to the N-th bank 210-N, such as when an initial power-on process associated with the other banks 210 has not completed and/or such as when a refresh operation associated with the other banks 210 has not completed. However, certain other banks 210 that are earlier in the power-on sequence may no longer have high power needs at the time at which power associated with the power-up sequence is initially supplied to the N-th bank 210-N, such as when an initial power-on process associated with the other banks 210 has completed and/or such as when a refresh operation associated with the other banks 210 has completed. For example, at the time at which power associated with the power-up sequence is initially supplied to the N-th bank 210-N, a power demand associated with the second bank 210-2 may have dissipated, indicated in FIG. 2E using light stippling. In this way, a peak power demand of the DRAM components 212 associated with the power-up event may be balanced over time.

Figure 2F:
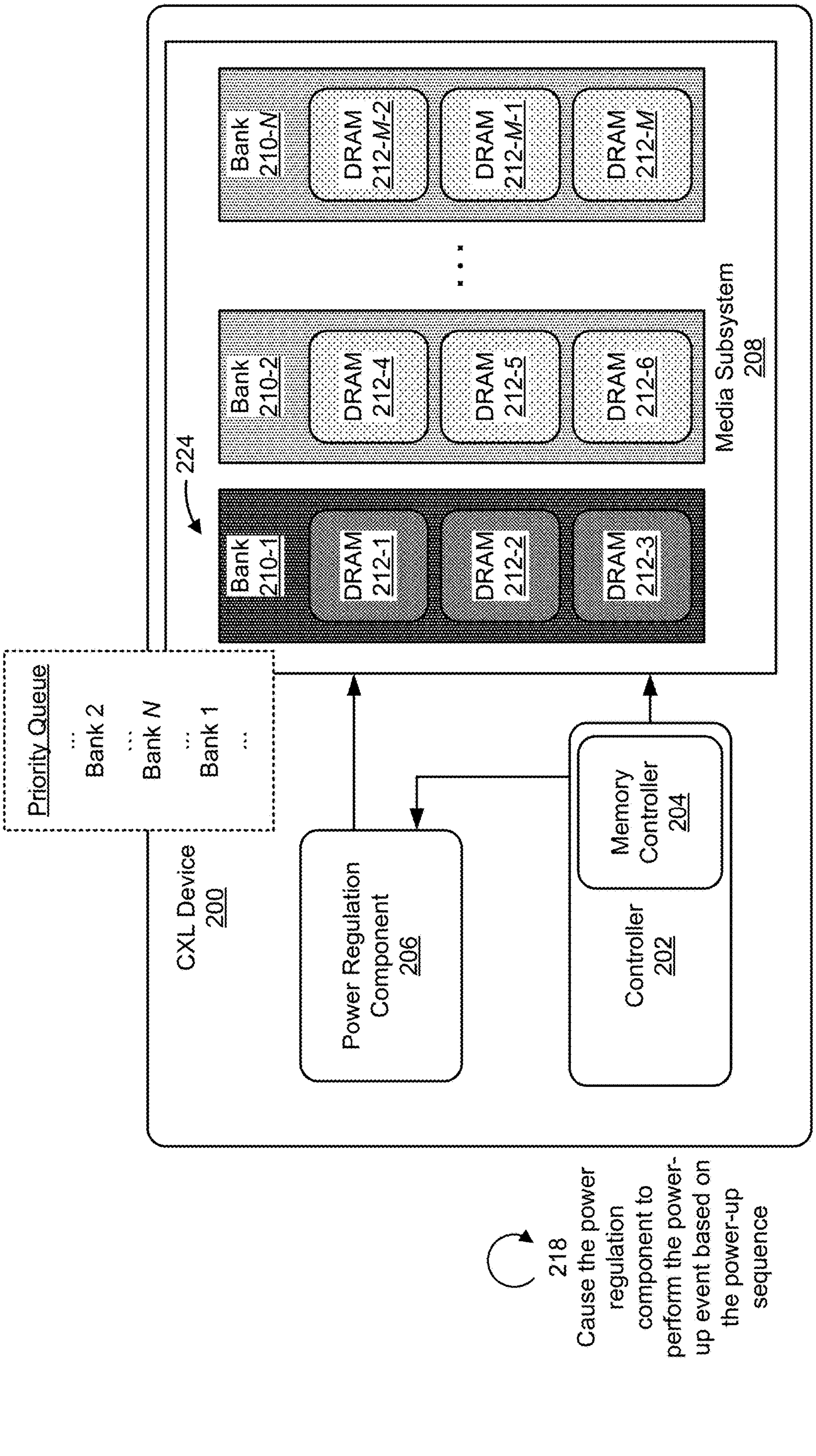

Similarly, after some configured delay, the power regulation component 206 may continue with supplying power to other banks 210, such as in an order indicated by the priority queue, among other examples. For example, as shown in FIG. 2F, and as indicated by reference number 224, the power regulation component 206 may next supply power to the first bank 210-1 (again depicted using dark stippling). As described above in connection with FIG. 2E, some other banks 210 that are earlier in the power-on sequence may no longer have high power needs at the time at which power associated with the power-up sequence is initially supplied to the first bank 210-1, such as when an initial power-on process associated with the other banks 210 has completed and/or such as when a refresh operation associated with the other banks 210 has completed. For example, at the time at which power associated with the power-up sequence is initially supplied to the first bank 210-1, a power demand associated with the second bank 210-2 and/or the N-th bank 210-N may have dissipated, indicated in FIG. 2F using light stippling. In this way, a peak power demand may be effectively balanced over time, resulting in increased longevity of the memory device, improved memory device performance, reduced memory device errors, and otherwise reduced power, computing, and storage resource consumption that would have otherwise been required to correct memory device errors.

As indicated above, FIGS. 2A-2F are provided as an example. Other examples may differ from what is described with regard to FIGS. 2A-2F.

Figure 3:
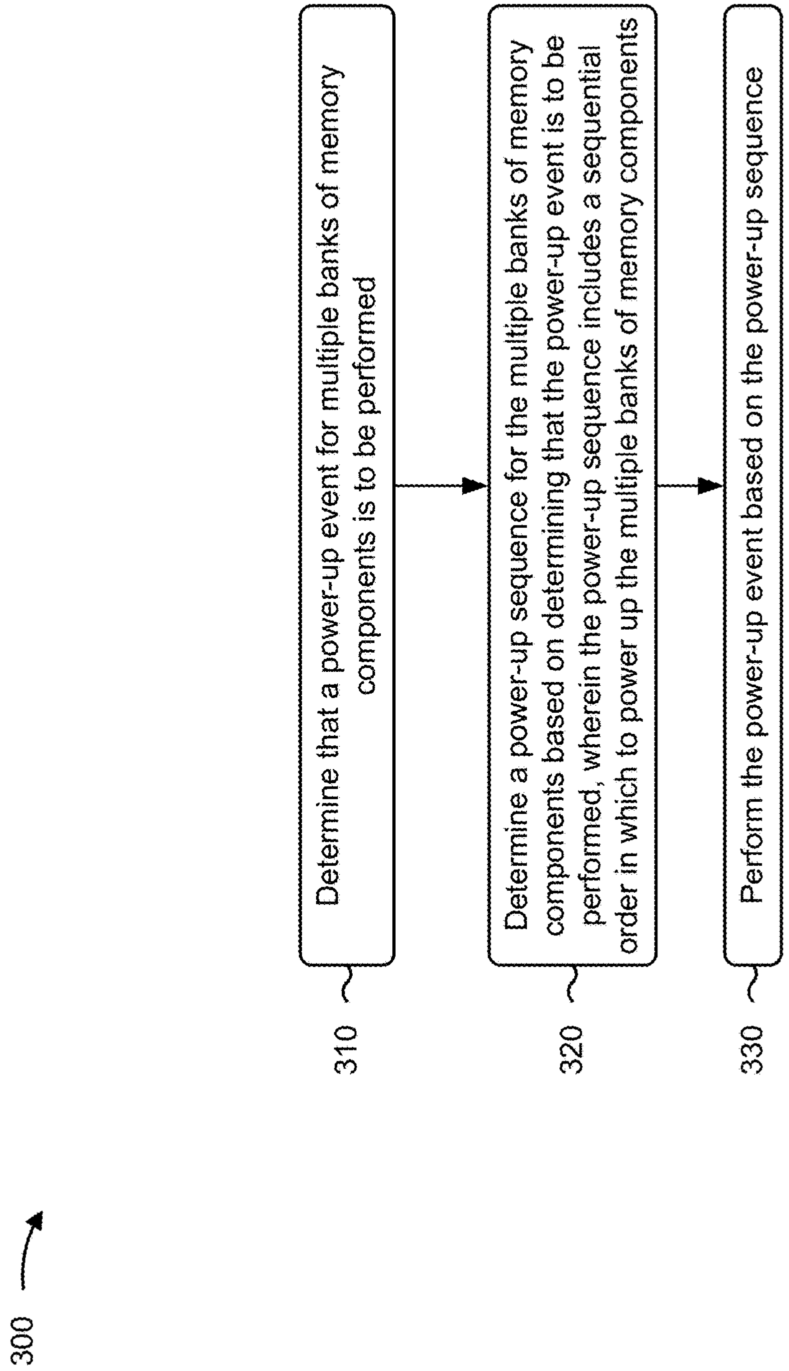
FIG. 3 is a flowchart of an example method associated with peak power demand balancing in memory devices.

FIG. 3 is a flowchart of an example method 300 associated with peak power demand balancing in memory devices. In some implementations, a memory device (e.g., the memory device 120) may perform or may be configured to perform the method 300. In some implementations, another device or a group of devices separate from or including the memory device (e.g., the system 100) may perform or may be configured to perform the method 300. Additionally, or alternatively, one or more components of the memory device (e.g., the memory system controller 115, the local controller 125, the CXL device 200, the central controller 202, the memory controller 204, the power regulation component 206, the media subsystem 208, and/or the banks 210) may perform or may be configured to perform the method 300. Thus, means for performing the method 300 may include the memory device and/or one or more components of the memory device. Additionally, or alternatively, a non-transitory computer-readable medium may store one or more instructions that, when executed by the memory device (e.g., the central controller 202 of the CXL device 200), cause the memory device to perform the method 300.

As shown in FIG. 3, the method 300 may include determining that a power-up event for multiple banks of memory components is to be performed (block 310). For example, the memory controller 204 of the CXL device 200 may determine that a power-up event (e.g., an initial power-on event, a refresh event, or a similar power-intensive event) is to be performed for the multiple banks 210 of DRAM components 212, as described above in connection with reference number 214 of FIG. 2B. As further shown in FIG. 3, the method 300 may include determining a power-up sequence for the multiple banks of memory components based on determining that the power-up event is to be performed, wherein the power-up sequence includes a sequential order in which to power up the multiple banks of memory components (block 320). For example, the memory controller 204 of the CXL device 200 may determine a power-up sequence to be performed for the multiple banks 210 of DRAM components 212, such as by determining the priority queue described above in connection with reference number 216 of FIG. 2C. As further shown in FIG. 3, the method 300 may include performing the power-up event based on the power-up sequence (block 330). For example, the memory controller 204 of the CXL device 200 may cause the power regulation component 206 to perform the power-up event such as by staggering power supply to the various banks 210 of DRAM components 212, as described above in connection with FIGS. 2D-2F.

The method 300 may include additional aspects, such as any single aspect or any combination of aspects described below and/or described in connection with one or more other methods or operations described elsewhere herein.

In a first aspect, the power-up event is associated with an initial power-on operation of the memory device.

In a second aspect, alone or in combination with the first aspect, the power-up event is associated with a refresh operation of the memory device.

In a third aspect, alone or in combination with one or more of the first and second aspects, the multiple memory components are multiple DRAM components, and the refresh operation of the operation includes performing a refresh for each DRAM component, of the multiple DRAM components.

In a fourth aspect, alone or in combination with one or more of the first through third aspects, determining the power-up sequence includes mapping logical addresses of the multiple memory components to respective physical locations of the multiple memory components.

In a fifth aspect, alone or in combination with one or more of the first through fourth aspects, determining the power-up sequence includes determining the power-up sequence based on respective power-up priority levels associated with the multiple banks of memory components. For example, the memory controller 204 of the CXL device 200 may determine that the banks 210 are to be powered up according to the priority queue described above in connection with reference number 216 of FIG. 2C, and thus the CXL device may stagger power supply to the various banks 210 based on the priority queue, among other examples.

In a sixth aspect, alone or in combination with one or more of the first through fifth aspects, determining the power-up sequence based on respective power-up priority levels associated with the multiple banks of memory components includes identifying that a first bank of memory components, of the multiple banks of memory components, is associated with a higher power-up priority level than a power-up priority level of a second bank of memory components, of the multiple banks of memory components, and determining that the first bank of memory components is to be powered up earlier in the power-up sequence than the second bank of memory components based on identifying that the first bank of memory components is associated with the higher power-up priority level than the power-up priority level of the second bank of memory components. For example, the memory controller 204 of the CXL device 200 may determine that the second bank 210-2 has a higher priority than the first bank 210-1 and the N-th bank 210-N, and/or that the N-th bank 201-N has a higher priority than the first bank 210-1, as described above in connection with reference number 216 of FIG. 2C. Accordingly, the memory controller 204 of the CXL device 200 may determine that, of the three depicted banks 210 in FIGS. 2A-2F, the second bank 210-2 is to be powered up first, the N-th bank 201-N is to be powered up second, and the first bank 210-1 is to be powered up third, as described above in connection with FIGS. 2D-2F.

Although FIG. 3 shows example blocks of a method 300, in some implementations, the method 300 may include additional blocks, fewer blocks, different blocks, or differently arranged blocks than those depicted in FIG. 3. Additionally, or alternatively, two or more of the blocks of the method 300 may be performed in parallel. The method 300 is an example of one method that may be performed by one or more devices described herein. These one or more devices may perform or may be configured to perform one or more other methods based on operations described herein.

In some implementations, a memory device includes multiple memory components organized into multiple banks of memory components; a power regulation component coupled to the multiple memory components and configured to supply power to the multiple memory components; and a memory controller coupled to the power regulation component and configured to: determine that a power-up event for the multiple banks of memory components is to be performed; determine a power-up sequence for the multiple banks of memory components based on determining that the power-up event is to be performed, wherein the power-up sequence includes a sequential order in which to power up the multiple banks of memory components; and cause the power regulation component to perform the power-up event based on the power-up sequence.

In some implementations, a method includes determining, by a memory device, that a power-up event for multiple banks of memory components is to be performed; determining, by the memory device, a power-up sequence for the multiple banks of memory components based on determining that the power-up event is to be performed, wherein the power-up sequence includes a sequential order in which to power up the multiple banks of memory components; and performing, by the memory device, the power-up event based on the power-up sequence.

In some implementations, a compute express link (CXL) compliant memory device includes multiple dynamic random access memory (DRAM) components organized into multiple banks of DRAM components; a power regulation component coupled to the multiple DRAM components and configured to supply power to the multiple DRAM components; and a memory controller coupled to the power regulation component and configured to: determine that a power-up event for the multiple banks of DRAM components is to be performed; determine a power-up sequence for the multiple banks of DRAM components based on determining that the power-up event is to be performed, wherein the power-up sequence includes a sequential order in which to power up the multiple banks of DRAM components; and cause the power regulation component to perform the power-up event based on the power-up sequence.

The foregoing disclosure provides illustration and description but is not intended to be exhaustive or to limit the implementations to the precise forms disclosed. Modifications and variations may be made in light of the above disclosure or may be acquired from practice of the implementations described herein.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

When "a component" or "one or more components" (or another element, such as "a controller" or "one or more controllers") is described or claimed (within a single claim or across multiple claims) as performing multiple operations or being configured to perform multiple operations, this language is intended to broadly cover a variety of architectures and environments. For example, unless explicitly claimed otherwise (e.g., via the use of "first component" and "second component" or other language that differentiates components in the claims), this language is intended to cover a single component performing or being configured to perform all of the operations, a group of components collectively performing or being configured to perform all of the operations, a first component performing or being configured to perform a first operation and a second component performing or being configured to perform a second operation, or any combination of components performing or being configured to perform the operations. For example, when a claim has the form "one or more components configured to: perform X; perform Y; and perform Z," that claim should be interpreted to mean "one or more components configured to perform X; one or more (possibly different) components configured to perform Y; and one or more (also possibly different) components configured to perform Z."

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A memory device, comprising:

multiple memory components organized into multiple banks of memory components;

a power regulation component coupled to the multiple memory components and configured to supply power to the multiple memory components; and a memory controller coupled to the power regulation component and configured to:

determine that a power-up event for the multiple banks of memory components is to be performed;

determine a power-up sequence for the multiple banks of memory components based on determining that the power-up event is to be performed, wherein the power-up sequence includes a sequential order in which to power up the multiple banks of memory components; and cause the power regulation component to perform the power-up event based on the power-up sequence.

2. The memory device of claim 1, wherein the power-up event is associated with an initial power-on operation of the memory device.

3. The memory device of claim 1, wherein the power-up event is associated with a refresh operation of the memory device.

4. The memory device of claim 3, wherein the multiple memory components are multiple dynamic random access memory (DRAM) components, and wherein the refresh operation of the operation includes performing a refresh for each DRAM component, of the multiple DRAM components.

5. The memory device of claim 3, wherein the memory controller, to determine the power-up sequence, is configured to map logical addresses of the multiple memory components to respective physical locations of the multiple memory components.

6. The memory device of claim 1, wherein the memory controller, to determine the power-up sequence, is configured to determine the power-up sequence based on respective power-up priority levels associated with the multiple banks of memory components.

7. The memory device of claim 6, wherein the memory controller, to determine the power-up sequence based on respective power-up priority levels associated with the multiple banks of memory components, is configured to:

identify that a first bank of memory components, of the multiple banks of memory components, is associated with a higher power-up priority level than a power-up priority level of a second bank of memory components, of the multiple banks of memory components; and determine that the first bank of memory components is to be powered up earlier in the power-up sequence than the second bank of memory components based on identifying that the first bank of memory components is associated with the higher power-up priority level than the power-up priority level of the second bank of memory components.

8. The memory device of claim 1, wherein the memory device is a compute express link (CXL) compliant memory device, and wherein the memory controller is a part of an application-specific integrated circuit (ASIC) central controller associated with the CXL memory device.

9. A method, comprising:

determining, by a memory device, that a power-up event for multiple banks of memory components is to be performed;

determining, by the memory device, a power-up sequence for the multiple banks of memory components based on determining that the power-up event is to be performed, wherein the power-up sequence includes a sequential order in which to power up the multiple banks of memory components; and performing, by the memory device, the power-up event based on the power-up sequence.

10. The method of claim 9, wherein the power-up event is associated with an initial power-on operation of the memory device.

11. The method of claim 9, wherein the power-up event is associated with a refresh operation of the memory device.

12. The method of claim 11, wherein the multiple memory components are multiple dynamic random access memory (DRAM) components, and wherein the refresh operation of the operation includes performing a refresh for each DRAM component, of the multiple DRAM components.

13. The method of claim 11, wherein determining the power-up sequence includes mapping logical addresses of the multiple memory components to respective physical locations of the multiple memory components.

14. The method of claim 9, wherein determining the power-up sequence includes determining the power-up sequence based on respective power-up priority levels associated with the multiple banks of memory components.

15. The method of claim 14, wherein determining the power-up sequence based on respective power-up priority levels associated with the multiple banks of memory components includes:

identifying that a first bank of memory components, of the multiple banks of memory components, is associated with a higher power-up priority level than a power-up priority level of a second bank of memory components, of the multiple banks of memory components; and determining that the first bank of memory components is to be powered up earlier in the power-up sequence than the second bank of memory components based on identifying that the first bank of memory components is associated with the higher power-up priority level than the power-up priority level of the second bank of memory components.

16. A compute express link (CXL) compliant memory device, comprising:

multiple dynamic random access memory (DRAM) components organized into multiple banks of DRAM components;

a power regulation component coupled to the multiple DRAM components and configured to supply power to the multiple DRAM components; and a memory controller coupled to the power regulation component and configured to:

determine that a power-up event for the multiple banks of DRAM components is to be performed;

determine a power-up sequence for the multiple banks of DRAM components based on determining that the power-up event is to be performed, wherein the power-up sequence includes a sequential order in which to power up the multiple banks of DRAM components; and cause the power regulation component to perform the power-up event based on the power-up sequence.

17. The CXL compliant memory device of claim 16, wherein the power-up event is associated with an initial power-on operation of the CXL compliant memory device.

18. The CXL compliant memory device of claim 16, wherein the power-up event is associated with performing a refresh operation for each DRAM component, of the multiple DRAM components.

19. The CXL compliant memory device of claim 18, wherein the memory controller, to determine the power-up sequence, is configured to map logical addresses of the multiple DRAM components to respective physical locations of the multiple DRAM components.

20. The CXL compliant memory device of claim 16, wherein the memory controller, to determine the power-up sequence, is configured to determine the power-up sequence based on respective power-up priority levels associated with the multiple banks of DRAM components.

* * * * *